(12) United States Patent
Lin

(10) Patent No.: US 10,073,274 B2
(45) Date of Patent: Sep. 11, 2018

(54) GRATING, MANUFACTURING METHOD THEREOF AND DISPLAY DEVICE

(71) Applicant: BOE Technology Group Co., Ltd., Beijing (CN)

(72) Inventor: Chia Chiang Lin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 201 days.

(21) Appl. No.: 14/771,283

(22) PCT Filed: Nov. 28, 2014

(86) PCT No.: PCT/CN2014/092550
§ 371 (c)(1),
(2) Date: Aug. 28, 2015

(87) PCT Pub. No.: WO2016/023301
PCT Pub. Date: Feb. 18, 2016

(65) Prior Publication Data
US 2016/0363778 A1 Dec. 15, 2016

(30) Foreign Application Priority Data
Aug. 15, 2014 (CN) .......................... 2014 1 0403901

(51) Int. Cl.
*G02B 27/22* (2018.01)
*H04N 13/04* (2006.01)
(Continued)

(52) U.S. Cl.
CPC ........... *G02B 27/2214* (2013.01); *G02B 5/18* (2013.01); *G02B 5/20* (2013.01);
(Continued)

(58) Field of Classification Search
CPC ................ G02B 27/2214; G02B 5/045; G02F 1/133516; H04N 13/0409; H04N 13/0415
(Continued)

(56) References Cited

U.S. PATENT DOCUMENTS 6,504,649 B1 * 1/2003 Myers .................... G02B 5/045
348/59
7,420,637 B2 * 9/2008 Imai .................... G02B 27/2214
349/110
(Continued)

FOREIGN PATENT DOCUMENTS

CN 101297414 A 10/2008
CN 102007434 A 4/2011
(Continued)

OTHER PUBLICATIONS

May 21, 2015—International Search Report Appn PCT/CN2014/092550 with Eng Tran of Written Opinion.
Jan. 13, 2016—(CN) Office Action App No. 201410403901.5.

*Primary Examiner* — Audrey Y Chang
(74) *Attorney, Agent, or Firm* — Banner & Witcoff, Ltd.

(57) ABSTRACT

A grating, a manufacturing method thereof and a display device are disclosed. The grating comprises: a substrate including a plurality of first view field regions (A1) and a plurality of second view field regions (A2) which are alternately distributed; a plurality of ridge structures formed on the substrate in each first view field region (A1) and each second view field region (A2); and a patterned light shield layer being formed on the ridge structures and including a plurality of light-blocking regions and a plurality of light-transmitting regions, wherein in each first view field region (A1), each light-transmitting region is formed on a sloping surface of a first side of each ridge structure; in each second view field region (A2), each light-transmitting region is formed on a sloping surface of a second side of each ridge (Continued)

structure; and the first side and the second side are two opposite sides.

16 Claims, 6 Drawing Sheets

(51) Int. Cl.
    *G02B 5/18*     (2006.01)
    *G02B 5/20*     (2006.01)
    *G02F 1/1335*     (2006.01)
    *H01L 51/52*     (2006.01)
    *H01L 51/56*     (2006.01)
    *H01L 27/32*     (2006.01)

(52) U.S. Cl.
    CPC .... *G02F 1/133504* (2013.01); *H01L 51/5262* (2013.01); *H01L 51/5268* (2013.01); *H01L 51/56* (2013.01); *H04N 13/0409* (2013.01); *H04N 13/0415* (2013.01); *G02B 2207/123* (2013.01); *G02F 1/133512* (2013.01); *H01L 27/32* (2013.01)

(58) Field of Classification Search
    USPC ............ 359/463, 464, 625; 349/106; 348/59
    See application file for complete search history.

(56) References Cited

U.S. PATENT DOCUMENTS

| | | | |
|---|---|---|---|
| 7,868,975 B2* | 1/2011 | Wu | ................... G02F 1/133516 349/106 |
| 2011/0182570 A1 | 7/2011 | Yeh | |
| 2011/0235362 A1 | 9/2011 | Liu | |
| 2014/0016207 A1* | 1/2014 | Char | ..................... G02B 5/045 359/625 |

FOREIGN PATENT DOCUMENTS

| | | |
|---|---|---|
| CN | 202056688 U | 11/2011 |
| CN | 103247665 A | 8/2013 |
| CN | 103454807 A | 12/2013 |
| CN | 103792607 A | 5/2014 |
| CN | 104166177 A | 11/2014 |
| JP | 2013254030 A | 12/2013 |

\* cited by examiner

GRATING, MANUFACTURING METHOD THEREOF AND DISPLAY DEVICE

The application is a U.S. National Phase Entry of International Application No. PCT/CN2014/092550 filed on Nov. 28, 2014, designated the U.S.A. and claiming priority to Chinese Patent Application No. 201410403901.5 filed on Aug. 15, 2014. The present application claims priority to and the benefit of the above-identified applications and the above-identified applications are incorporated by reference herein in their entirety.

TECHNICAL FIELD

Embodiments of the present invention relate to a grating, a manufacturing method thereof and a display device.

BACKGROUND

Currently, dual field display technology has become one of research hotspots. Dual field display technology refers to the display technology in which different images can be seen from both sides (e.g., the left side and the right side) of a display. The conventional dual field display technology is mainly achieved by utilization of a grating (parallax barrier) bonded to the outside of a display panel. As illustrated in FIG. 1 which is a schematic sectional view of the conventional dual field display device, the display panel comprises at least two display regions 11 and 12 configured to display different images; a light-shielding pattern 2 is disposed in front of the display panel 100 and includes light-blocking regions and light-transmitting regions which are alternately arranged; due to the light-shielding pattern 2, partial display regions of the display panel can only be respectively seen from the left side 31 and the right side 32 of the screen (12 is seen from the left side and 11 is seen from the right side); regions 33 disposed in the middle are crosstalk regions; and hence dual field display can be achieved. In the dual field display device as shown in FIG. 1, in order to ensure the display effect, enough distance must be kept between the grating and the display panel, and hence the overall thickness of the display device can be larger.

SUMMARY

Embodiments of the present invention provide a grating, a manufacturing method thereof and a display device. The dual field display device comprising the grating has a small thickness.

In one aspect, an embodiment of the present invention provides a grating, which comprises: a substrate including a plurality of first view field regions and a plurality of second view field regions which are alternately distributed; a plurality of ridge structures formed on the substrate in each first view field region and each second view field region; and a patterned light shield layer being formed on the ridge structures and including a plurality of light-blocking regions and a plurality of light-transmitting regions. In each first view field region, each light-transmitting region is formed on a sloping surface of a first side of each ridge structure; in each second view field region, each light-transmitting region is formed on a sloping surface of a second side of each ridge structure; and the first side and the second side are two opposite sides.

In another aspect, an embodiment of the present invention further provides a grating manufacturing method, which comprises: forming a transparent material layer on a substrate; forming ridge structures by patterning the transparent material layer; forming a light-shielding material layer on the substrate provided with the ridge structures; and patterning the light-shielding material layer, to form light-transmitting regions on sloping surfaces of first sides of the ridge structures in first view field regions, form light-transmitting regions on sloping surfaces of second sides of the ridge structures in second view field regions, and form a patterned light shield layer provided with a plurality of light-blocking regions and a plurality of light-transmitting regions.

In still another aspect, an embodiment of the present invention further provides a display device, which comprises: a display panel; and the foresaid grating.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments.

All the other embodiments obtained by those skilled in the art without creative efforts on the basis of the embodiments of the present invention illustrated shall fall within the scope of protection of the present invention.

Figure 1:
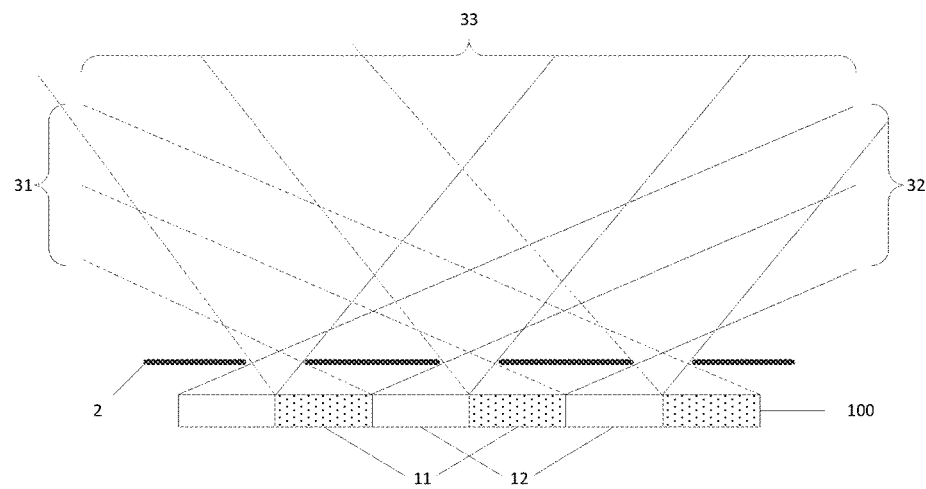
FIG. 1 is a structural sectional view of a conventional dual field display device.
Figure 2:
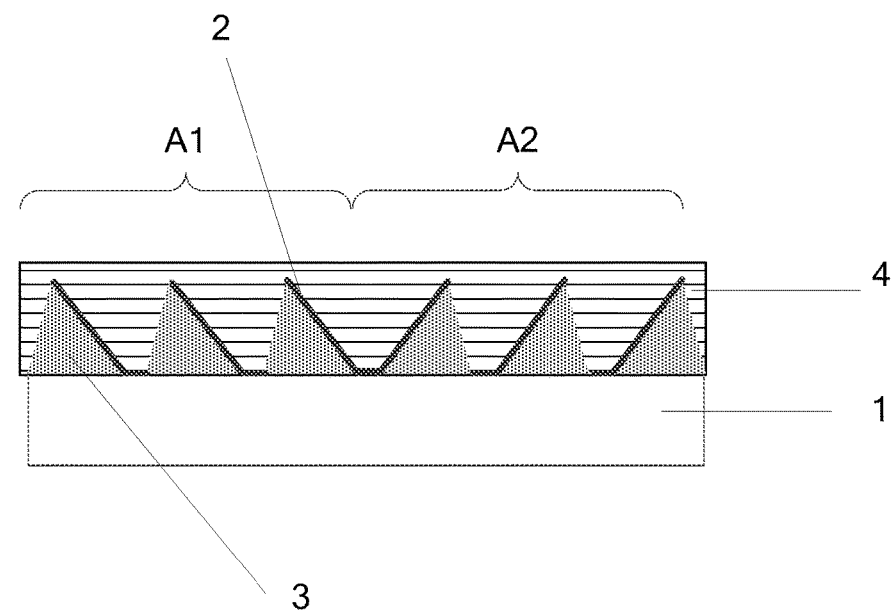
FIG. 2 is an illustrative structural sectional view of a grating provided by an embodiment of the present invention.
Figure 3:
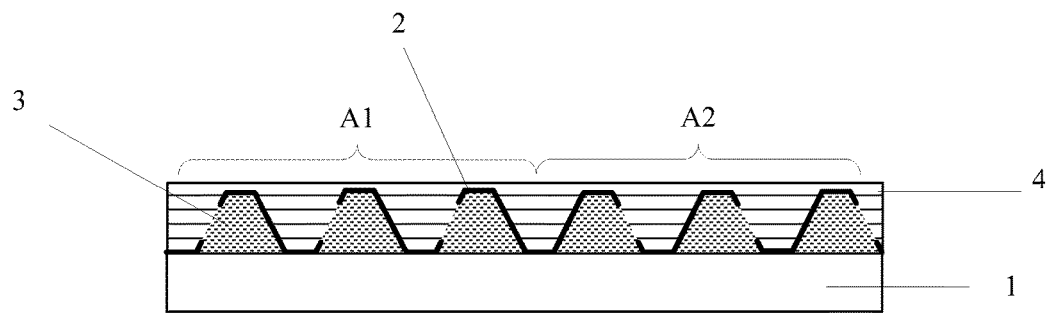
FIG. 3 is a structural sectional view of another grating provided by an embodiment of the present invention.

An embodiment of the present invention provides a grating. As illustrated in FIGS. 2 and 3, the grating comprises a substrate 1 and a patterned light shield layer 2 formed on the substrate 1; the substrate 1 includes first view field regions A1 and second view field regions A2 which are alternately distributed; and the patterned light shield layer 2 includes light-blocking regions and light-transmitting regions.

In the first view field regions A1 and the second view field regions A2, the grating provided by the embodiment of the present invention further comprises ridge structures 3 formed on the substrate 1; the patterned light shield layer 2 is formed on the ridge structures 3; in the first view field regions A1, the light-transmitting regions are formed on sloping surfaces of first sides of the ridge structures 3, e.g., sloping surfaces of left sides as shown in FIGS. 2 and 3; in the second view field regions A2, the light-transmitting regions are formed on sloping surfaces of second sides of the ridge structures 3, e.g., sloping surfaces of right sides as shown in FIGS. 2 and 3; and in the first view field regions A1 and the second view field regions A2, other regions except the light-transmitting regions are all light-blocking regions (covered by the light-shielding material).

In practice, the substrate 1 and the ridge structures 3 referred to in the embodiment of the present invention may be transparent structures, e.g., structures made from a transparent resin or the like; and the substrate 1 and the ridge structures 3 may be two structures formed independently or may be an integrally formed overall structure.

In the embodiment of the present invention, the first view field regions A1 refer to regions on the grating in which a first image is transmitted; correspondingly, the second view field regions A2 refer to regions on the grating in which a second image is transmitted; and the first view field regions A1 and the second view field regions A2 are not intended to limit the structure of the substrate 1 in corresponding regions. Illustratively, each first view field region A1 and each second view field region A2 herein may only correspond to a sub-pixel of a display panel and may also both correspond to a sub-pixel of the display panel. In another aspect, each view field region may correspond to a ridge structure 3 and may also correspond to a plurality of ridge structures 3. Illustratively, one view field region corresponds to a plurality of ridge structures 3, so that the height of the ridge structures 3 can be lower, and hence the overall thickness of the grating can be reduced. FIGS. 2 and 3 illustrate the case that one view field region corresponds to three ridge structures 3.

Illustratively, the cross-sectional shape of the ridge structure 3, namely the shape of a cross-section perpendicular to a plane of the substrate, may be triangular (as shown in FIG. 2), trapezoidal (as shown in FIG. 3) or in the shape similar to a triangle or a trapezoid, e.g., semi-elliptical or semicircular.

Figure 4:
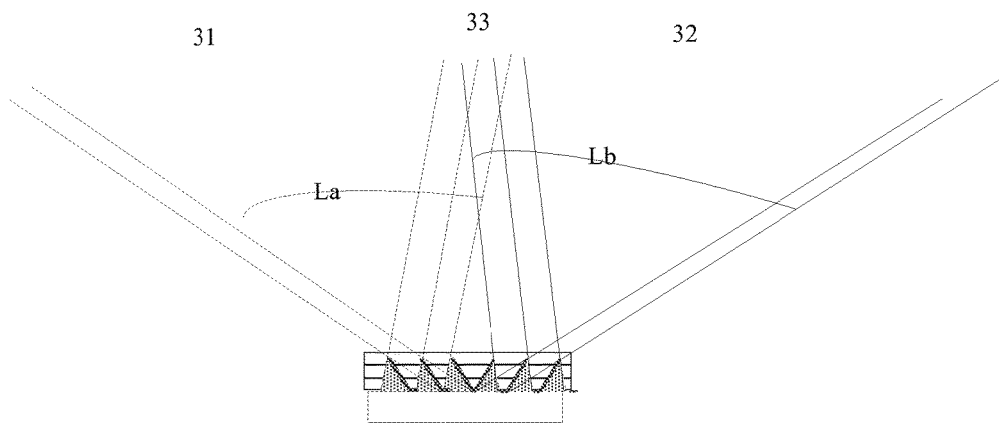
FIG. 4 is a schematic diagram illustrating the principle of the grating as shown in FIG. 2 in achieving a dual field display.

Description will be given below to the principle of the grating provided by the embodiment of the present invention in achieving dual display with reference to the grating as shown in FIG. 2. As illustrated in FIG. 4, light incident from the first view field region to various directions of the ridge structures can only be emitted from light-transmitting regions of the first view field region; part in the emergent light is blocked by light-blocking regions on adjacent ridge structures; the finally formed view field range is La as shown in FIG. 4; correspondingly, as for light incident from the second view field region to the ridge structures, the finally formed view field range is Lb as shown in FIG. 4; an image of the first view field region can be finally observed from a region that is in La but not overlapped with Lb, and a first view field 31 is formed; an image of the second view field region can be finally observed from a region that is in Lb but not overlapped with La, and a second view field 32 is formed; and a region that is in La and overlapped with Lb as well is a crosstalk region 33. It should be understood by those skilled in the art that the grating as shown in FIG. 3 can also achieve the same effect. Of course, in practice, light may be deflected to a certain degree when entering different structures, but the scope of protection of the embodiment of the present invention shall not be affected on the whole, and thus, the case is not reflected in the figure.

In the embodiment of the present invention, the light-transmitting regions are formed on the sloping surfaces of the ridge structures; and the angle of each view field is finally determined by the angle of gradient of the sloping surface of the ridge structure. Thus, even the grating is close to pixels, dual field display can also be better achieved. Therefore, the display device employing the grating provided by the embodiment of the present invention has a small thickness. In addition, in the manufacturing process, the sloping surface of the ridge structure can be easily designed; and correspondingly, the manufacturing difficulty of the ridge structure is also lowered. The multi-field display device employing the grating provided by the embodiment of the present invention has low manufacturing difficulty, and the dual field display effect is finally determined by the sloping surface of the ridge structure.

Illustratively, as shown in FIG. 2, in the first view field region A1, the angle of gradient of the sloping surface of the first side of the ridge structure 3 is greater than that of the sloping surface of the second side; and in the second view field region A2, the angle of gradient of the sloping surface of the second side of the ridge structure 3 is greater than that of the sloping surface of the first side.

It can been seen from FIG. 4 that, the crosstalk region 33 is mainly defined by extension lines of the sloping surfaces (the sloping surfaces provided with the light-transmitting regions) of the first sides of the ridge structures in the first view field region A1 and extension lines of the sloping surfaces (the sloping surfaces provided with the light-transmitting regions) of the second sides of the ridge structures 3 in the second view field region A2, thus the larger the angle of gradient of the sloping surfaces provided with the light-transmitting regions is, the smaller the corresponding crosstalk region is, and correspondingly, the produced first view field and second view field are larger. Of course, in practice, the angle of gradient of the sloping surface provided with the light-transmitting region may also be not more than that of the sloping surface of the other side. The foresaid should not be construed as the limitation onto the scope of protection of the embodiment of the present invention. In addition, it should be understood by those skilled in the art: when the cross-sectional shape of the ridge structure is in a shape other than a triangle, the angle of gradient of the sloping surface provided with the light-transmitting region is greater than that of the sloping surface of the other side; similar effect can also be achieved; and the corresponding technical proposals shall also fall within the scope of protection of the embodiment of the present invention.

Illustratively, in the first view field region A1, the angle of gradient of the sloping surface of the first side is from 60 to 85 degrees, and the angle of gradient of the sloping surface of the second side is from 68 to 70 degrees; and in the second view field region A2, the angle of gradient of the sloping surface of the first side is from 68 to 70 degrees, and the angle of gradient of the sloping surface of the second side is from 60 to 85 degrees. The view field range is large within the above angle range, and the grating can be easily manufactured.

Illustratively, the height of the ridge structure is 5 to 50 μm. The dual field effect is obvious within the height range and the thickness of the display panel will not be overlarge.

Illustratively, in the grating provided by the embodiment of the present invention, the substrate 1 and the ridge structures 3 have a same refractive index, e.g., 1.5 for both. In the first view field region A1, the angle of gradient of the sloping surface of the first side may be 80.7 degrees; the angle of gradient of the sloping surface of the second side may be 70 degrees; and the height of the ridge structure 3 may be 30 μm. Correspondingly, in the second view field region A2, the angel of gradient of the second side may be 80.7 degrees; the angle of gradient of the first side may be 70 degrees; and the height of the ridge structure 3 may be 30 μm. In this case, as the maximum angle (80.7 degrees) of the ridge structure 3 is relatively small, the manufacturing process is relatively simple, but the range of the view field formed at this point is relatively small.

Illustratively, in the grating provided by the embodiment of the present invention, the substrate 1 and the ridge structures 3 have a same refractive index, e.g., 1.5 for both. In the first view field region A1, the angle of gradient of the sloping surface of the first side may be 83.4 degrees; the angle of gradient of the sloping surface of the second side may be 68 degrees; and the height of the ridge structure 3 may be 17 μm. Correspondingly, in the second view field region A2, the angel of gradient of the second side may be 80.7 degrees; the angle of gradient of the first side may be 70 degrees; and the height of the ridge structure 3 may be 30 μm. In this case, as the maximum angle (83.4 degrees) of the ridge structure 3 is relatively large, the manufacturing process is relatively complex, but the range of the view field formed at this point is relatively large.

Illustratively, as shown in FIG. 3, in the first view field region A1, the length of the light-transmitting region along the direction of the sloping surface is less than the length of the sloping surface of the first side; the sloping surface of the second side is completely covered by light-shielding materials; and part of the sloping surface of the first side is covered by the light-shielding material. In the second view field region A2, the length of the light-transmitting region along the direction of the sloping surface is less than the length of the sloping surface of the second side; the sloping surface of the first side is completely covered by the light-shielding material; and part of the sloping surface of the second side is covered by the light-shielding material.

Thus, the range of the crosstalk region can be beneficially reduced. In addition, it should be understood by those skilled in the art: when the cross-sectional shape of the ridge structure is in a shape other than a trapezoid, the length of the sloping surface of the light-transmitting region is less than the length of the sloping surface provided with the light-transmitting region; similar effect can also be achieved; and the corresponding technical proposals shall also fall within the scope of protection of the embodiment of the present invention.

Illustratively, as shown in FIG. 2 or 3, the grating provided by the embodiment of the present invention may further comprise: a planarization layer 4 formed on the ridge structures 3 and the patterned light shield layer 2. Thus, the surface of the grating in the light-emitting direction can be flat. It should be noted that the planarization layer 4 here is not the necessary structure in some applications.

Moreover, illustratively, non-image regions may also be disposed between view field regions corresponding to sub-pixels of different colors. The non-image regions are completely covered by the light-shielding material, and no light can be transmitted through the non-image regions. For instance, the light-shielding material may be directly formed and configured to cover the entire non-image region; or ridge structures may also be disposed in the non-image regions and the light-shielding materials are formed on the entire ridge structures. The design can further avoid the crosstalk between different colors. But in practice, the light-shielding regions are alternated between adjacent sub-pixels of a display panel, or even though the light-shielding regions are not alternated, adjacent sub-pixels correspond to different view field regions, so that even the non-image regions are not arranged, the crosstalk of different colors can also be avoided to a certain degree.

The embodiment of the present invention further provides a grating manufacturing method, which may be used for manufacturing any foresaid grating. Description will be given below by supposing that the manufactured grating is the grating as shown in FIG. 3. The method comprises the following steps:

S1: forming a transparent material layer on a substrate.

Figure 5:
FIG. 5 is a structural sectional view of the structure obtained after step S1 in the grating manufacturing method provided by an embodiment of the present invention.

Illustratively, a transparent resin material such as acrylic resin may be coated on the substrate. The structure obtained after the step Si may be as shown in FIG. 5.

S2: forming ridge structures by patterning the transparent material layer.

Illustratively, photoresist may be coated on the transparent material layer at first and hence subjected to exposure and development via a mask plate to form patterned photoresist; and subsequently, the transparent material layer is etched under the protection of the patterned photoresist to form the ridge structures.

Figure 6:
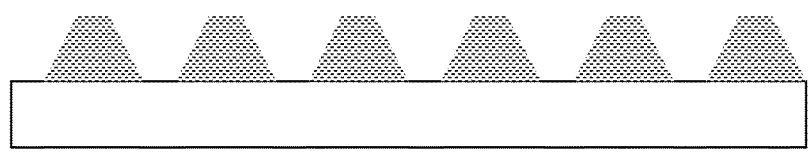
FIG. 6 is a structural sectional view of the structure obtained after step S2 in the grating manufacturing method provided by an embodiment of the present invention.

The cross-sectional shape of the ridge structures here may be triangular, trapezoidal or in the shape similar to a triangle or a trapezoid. In the embodiment of the present invention, supposing the cross-sectional shape of the formed ridge structures is trapezoidal, the structure obtained after step S2 is as shown in FIG. 6.

S3: forming a light-shielding material layer on the substrate provided with the ridge structures.

Figure 7:
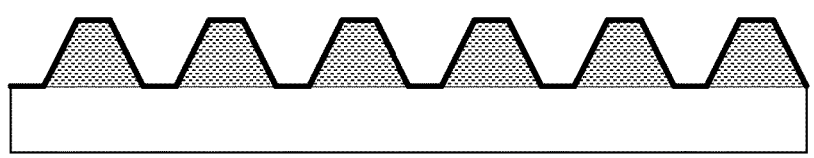
FIG. 7 is a structural sectional view of the structure obtained after step S3 in the grating manufacturing method provided by an embodiment of the present invention.

Illustratively, a light-absorbing material, e.g., a mixture of acetic acid esters and carbon black, may be deposited on the ridge structures by, for instance, a coating process. The deposited light-absorbing material may be 1 μm in thickness. The structure obtained after step S2 is as shown in FIG. 7.

S4: forming a patterned light shield layer by patterning the light-shielding material layer, so as to form light-transmitting regions on sloping surfaces of first sides of the ridge structures in first view field regions and form light-transmitting regions on sloping surfaces of second sides of the ridge structures in second view field regions.

Figure 8:
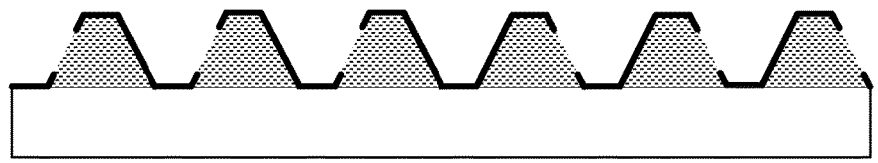
FIG. 8 is a structural sectional view of the structure obtained after step S4 in the grating manufacturing method provided by an embodiment of the present invention.

The structure obtained after step S4 is as shown in FIG. 8.

After step S4, the method further comprises step S5: forming a planarization layer on the patterned light shield layer and the ridge structures by, for instance, coating a transparent material. Thus, the grating is manufactured, and the grating as shown in FIG. 3 is formed. Of course, the grating is not provided with the planarization layer in some applications. Correspondingly, step S5 is not required to be executed in the manufacturing process of the grating.

It should be noted that, although description has been given to the grating manufacturing method provided by the embodiment of the present invention by taking the manufacturing process of the grating as shown in FIG. 3 as an example, it can be easily understood that the above grating manufacturing method may be actually used for manufacturing any foresaid grating.

Figure 9:
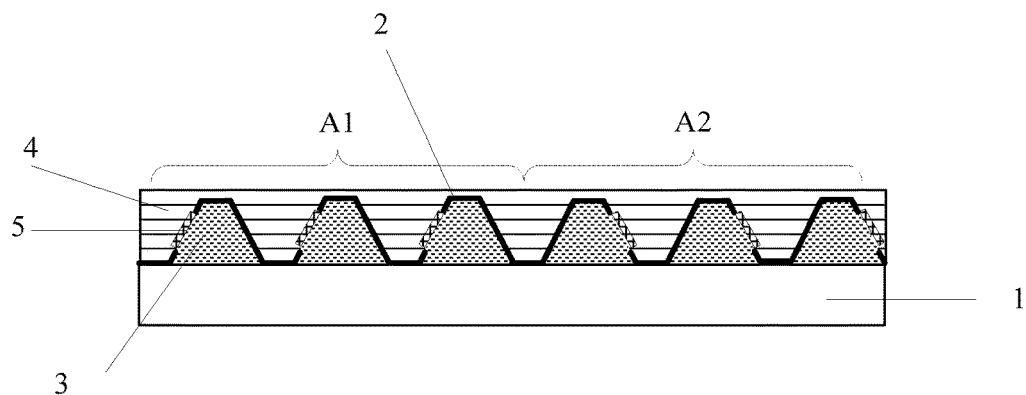
FIG. 9 is a structural sectional view of still another grating provided by an embodiment of the present invention.
Figure 10:
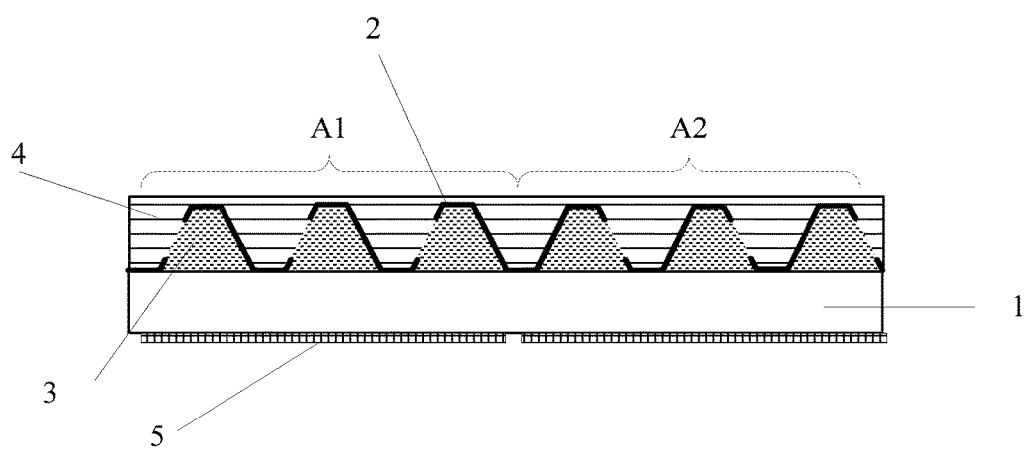
FIG. 10 is a structural sectional view of still another grating provided by an embodiment of the present invention.
Figure 11:
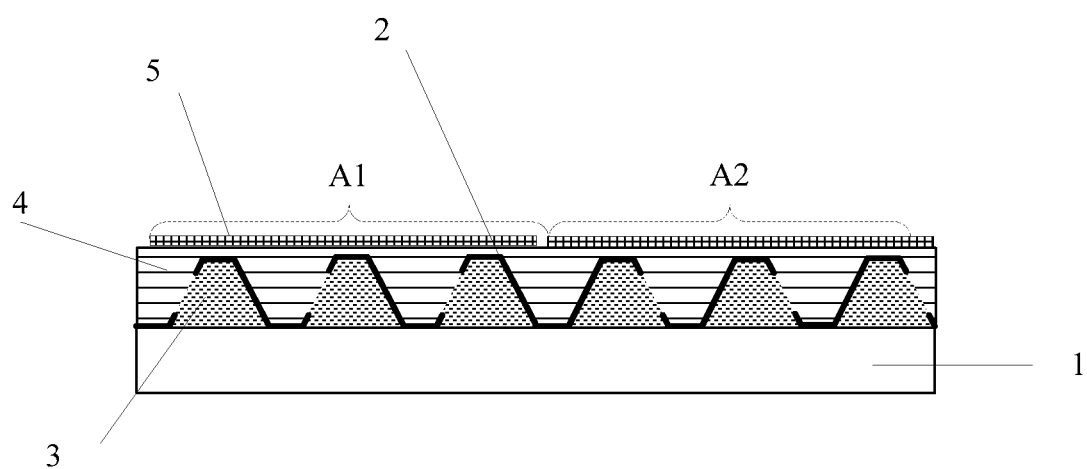
FIG. 11 is a structural sectional view of still another grating provided by an embodiment of the present invention.

Illustratively, as shown in FIG. 9, 10 or 11, the grating provided by the embodiment of the present invention may further comprise a color filter (CF) layer 5. The CF layer 5 corresponds to the light-transmitting regions of the patterned light shield layer 2.

It should be noted that the CF layer 5 here is used for light filtering. Illustratively, the CF layer 5 here generally includes a red CF layer, a blue CF layer and a green CF layer which are respectively used for producing red light, blue light and green light. It should be noted that, although the case that the CF layer 5 is included has been shown in FIGS. 9, 10 and 11, in practice, if the display panel can emit colored light, e.g., a color OLED panel or an LCD device comprising a CF layer, the grating provided by the embodiment of the present invention may not comprise the CF layer. In specific applications, the grating may be directly bonded to the outside of a corresponding display panel, or an opposing substrate on a light-emitting side of the display panel is taken as the substrate 1 of the grating provided by the embodiment of the present invention. That is to say, the substrate is shared by the grating and units on the opposing substrate 30 of the display panel.

As for the grating comprising the CF layer, the grating may be taken as the opposing substrate of the display device, for instance, a CF substrate of a white OLED (WOLED) display device or an LCD device. It should be noted that other components, e.g., black matrix (BM), may be also formed on the substrate provided with the CF layer and the patterned light shield layer 2. No further description will be given here. Thus, compared with the conventional CF substrate, the CF substrate in the embodiment of the present invention can achieve dual field display by only additionally arranging the ridge structures and the patterned light shield layer, not requiring an additional parallax barrier. Therefore, the manufacturing difficulty of the dual field display device can be greatly reduced.

Illustratively, as shown in FIG. 9, the CF layer 5 is formed in the light-transmitting regions on the ridge structures 3. At this point, if the grating further comprises a planarization layer 4, the planarization layer 4 covers the CF layer 5.

Illustratively, as shown in FIG. 10, the CF layer 5 is specifically formed on one side of the substrate 1 opposite to the ridge structures 3.

It can be easily understood that the above grating manufacturing method may also be simply modified by those skilled in the art and configured to manufacture the grating provided with the CF layer. The specific process will not be described here in detail.

Illustratively, as shown in FIG. 11, when the grating comprises a planarization layer 4, the CF layer 4 may be formed on the planarization layer 4.

In the grating as shown in FIGS. 9, 10 and 11, one sub-pixel corresponds to a plurality of ridge structures 3. In this way, the thickness of the grating can be reduced. Illustratively, if the thickness is not considered, one sub-pixel may correspond to one ridge structure 3.

Figure 12:
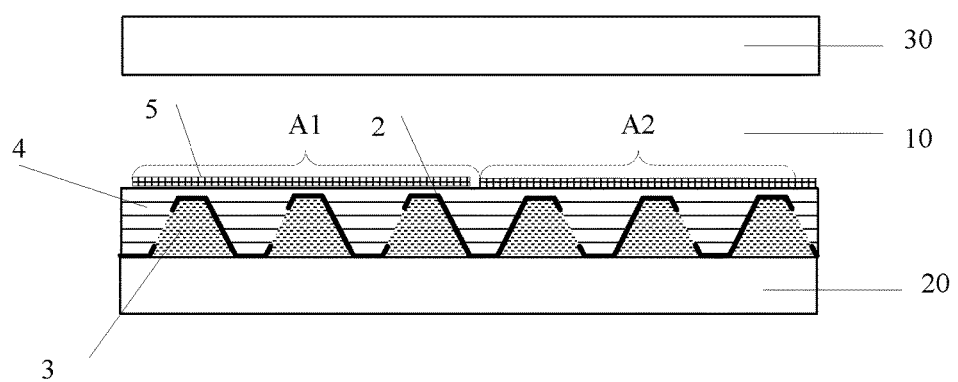
FIG. 12 is a structural sectional view of a display device provided by an embodiment of the present invention.
Figure 13:
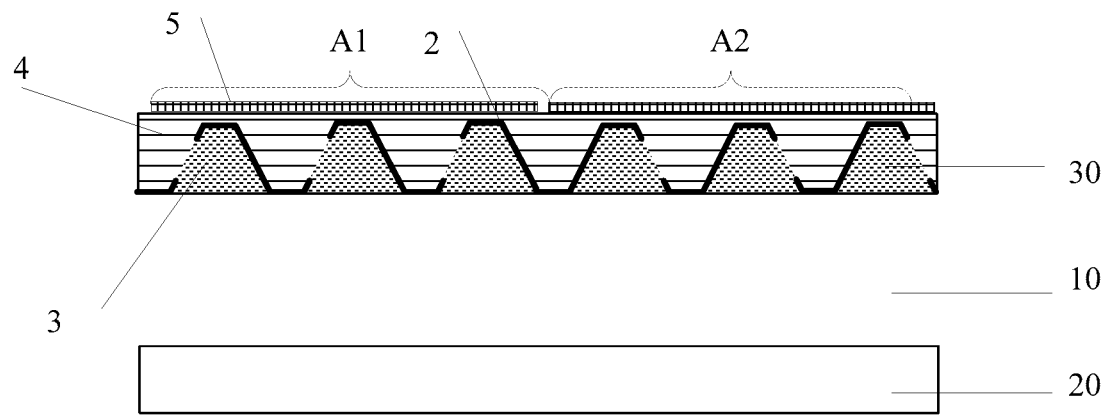
FIG. 13 is a structural sectional view of a display device provided by an embodiment of the present invention.
Figure 14:
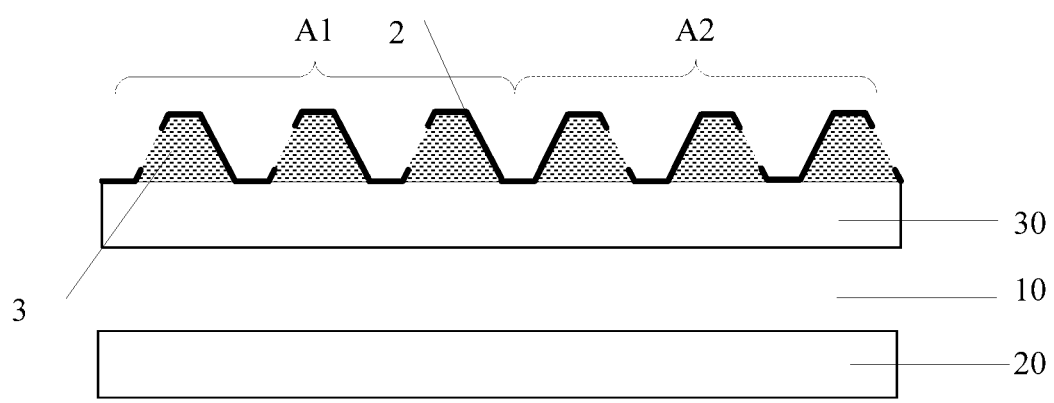
FIG. 14 is a structural sectional view of a display device provided by an embodiment of the present invention.

In addition, the embodiment of the present invention further provides a display device, which comprises any foresaid grating, and display panel as shown in FIGS. 12-14, for example. The display panel includes an array substrate 20 and an opposing substrate 30 arranged opposite to each other. The grating is disposed on one side of the opposing substrate. The substrate of the grating is a base substrate of the opposing substrate.

The display device herein may be a color OLED display device. As a color OLED can emit colored light, the dual field display device can be obtained by only additionally arranging one layer of grating not provided with the CF layer on the outside of the display panel.

The display device herein may also be an OLED display device. At this point, the grating not provided with the CF layer 5 may be additionally arranged on the outside of a display panel, or the grating provided with the CF layer 5 is taken as an opposing substrate 1 of the display panel. In addition, other components, e.g., black matrix, may also be formed on the opposing substrate taken as the grating. That is to say, all the components on the opposing substrate 1 of the display panel are formed on the substrate 1 of the grating. No example will be given below one by one. For instance, when the grating is a CF substrate of the OLED display device, the grating may comprise the planarization layer 4 and may also not comprise the planarization layer 4.

In another aspect, the display device herein may also be an LCD device. The grating not provided with the CF layer may be additionally arranged on the outside of a display panel or the grating provided with the CF layer is taken as a CF substrate of the display panel. In addition, other components, e.g., black matrix, may also be formed on the CF substrate taken as the grating. That is to say, all the components on the CF substrate of the display panel are formed on the substrate of the grating. No example will be given below one by one. Illustratively, the grating may comprise the planarization layer 4, so that the thickness of liquid crystals 10 between the grating and an array substrate 20 can be uniform.

Any foresaid display device may be any product or component with display function such as e-paper, a mobile phone, a tablet PC, a TV, a display, a notebook computer, a digital picture frame and a navigator.

In the grating provided by the embodiment of the present invention, the light-transmitting regions are formed on the sloping surfaces of the ridge structures; the angle of each field of the grating is finally determined by the angle of gradient of the sloping surface of the ridge structure; thus, even the grating is close to the pixels, the dual field display can be also better achieved; and hence the display device employing the grating provided by the embodiment of the present invention has a small thickness. Meanwhile, the grating provided by the embodiment of the present invention does not adopt the conventional design of plane gratings and adopts a three-dimensional (3D) grating. In addition, the angle of each field of the grating provided by the embodiment of the present invention is finally determined by the angle of gradient of the sloping surface of the ridge structure. But in the manufacturing process, the angle of gradient of the sloping surface of the ridge structure can be easily designed. Correspondingly, the manufacturing difficulty of the ridge structure is also lower. Therefore, the dual field display device employing the grating provided by the embodiment of the present invention has low manufacturing difficulty.

The foresaid embodiments are only intended to illustrate the present invention and not intended to limit the present invention. Although detailed description has been given to the present invention with reference to the preferred embodiments, it should be understood by those skilled in the art that various combinations, modifications or equivalent replacements made to the technical proposals of the present invention shall not depart from the spirit and the scope of the technical proposals of the present invention and shall all fall within the scope of the claims of the present invention.

The application claims priority to the Chinese patent application No. 201410403901.5, filed on Aug. 15, 2014, the disclosure of which is incorporated herein by reference as part of the application.

The invention claimed is:

1. A grating, comprising:
a substrate including a plurality of first view field regions and a plurality of second view field regions, which are alternately distributed;
a plurality of ridge structures formed on the substrate in each first view field region and each second view field region;
a patterned light shield layer formed on the ridge structures and including a plurality of light-blocking regions and a plurality of light-transmitting regions; and
a color filter (CF) layer arranged corresponding to the light-transmitting regions of the patterned light shield layer,
wherein
in each first view field region, each light-transmitting region is formed on a sloping surface of a first side of each ridge structure; in each second view field region, each light-transmitting region is formed on a sloping surface of a second side of each ridge structure; and the first side and the second side are two opposite sides;
in each first view field region, a length of each light-transmitting region along a direction of the sloping surface with the light shield layer is less than a length of the sloping surface with the light shield layer of the first side;
in each second view field region, a length of each light-transmitting region along the direction of the sloping surface with the light shield layer is less than a length of the sloping surface with the light shield layer of the second side; and
the CF layer is formed in the light-transmitting regions on the ridge structures.

2. The grating according to claim 1, wherein in each first view field region, an angle of gradient of the sloping surface of the first side of the ridge structure is greater than that of a sloping surface of its second side; and in each second view field region, an angle of gradient of the sloping surface of the second side of the ridge structure is greater than that of a sloping surface of its first side.

3. The grating according to claim 2, wherein in each first view field region, the angle of gradient of the sloping surface of the first side is from 60 to 85 degrees and the angle of gradient of the sloping surface of the second side is from 68 to 70 degrees; and
in each second view field region, the angle of gradient of the sloping surface of the first side is from 68 to 70 degrees and the angle of gradient of the sloping surface of the second side is from 60 to 85 degrees.

4. The grating according to claim 3, wherein a height of each ridge structure is from 5 μm to 50 μm.

5. The grating according to claim 1, further comprising: a planarization layer formed on the ridge structures and the patterned light shield layer.

6. The grating according to claim 1, wherein a light-shielding material is formed in the light-blocking regions.

7. The grating according to claim 1, wherein the substrate and the plurality of ridge structures are in an integrated structure.

8. The grating according to claim 1, wherein a cross-sectional shape of each of the plurality of ridge structures is triangular, trapezoidal, semi-elliptical or semicircular.

9. The grating according to claim 1, wherein the CF layer is formed on one side of the substrate opposite to the ridge structures.

10. The grating according to claim 1, further comprising: a planarization layer formed on the ridge structures and the patterned light shield layer, in which the CF layer is formed on the planarization layer.

11. A grating manufacturing method, comprising:
forming a transparent material layer on a substrate;
forming ridge structures by patterning the transparent material layer;
forming a light-shielding material layer on the substrate provided with the ridge structures;
patterning the light-shielding material layer, to form light-transmitting regions on sloping surfaces of first sides of the ridge structures in first view field regions, and form each light-transmitting region to have a length along a direction of the sloping surface with the light shield layer less than a length of the sloping surface with the light shield layer of the first side in each first view field region, form light-transmitting regions on sloping surfaces of second sides of the ridge structures in second view field regions, and form a patterned light shield layer provided with a plurality of light-blocking regions and a plurality of light-transmitting regions, and form each light-transmitting region to have a length along the direction of the sloping surface with the light shield layer less than a length of the sloping surface with the light shield layer of the second side in each second view field region; and
forming a color filter (CF) layer in the light-transmitting regions on the ridge structures.

12. A display device, comprising: a display panel; and a grating, wherein the grating comprises:
a substrate including a plurality of first view field regions and a plurality of second view field regions, which are alternately distributed;
a plurality of ridge structures formed on the substrate in each first view field region and each second view field region;
a patterned light shield layer formed on the ridge structures and including a plurality of light blocking regions and a plurality of light-transmitting regions; and
a color filter (CF) layer arranged corresponding to the light-transmitting region of the patterned light shield layer,
wherein
in each first view field region, each light-transmitting region is formed on a sloping surface of a first side of each ridge structure; in each second view field region, each light-transmitting region is formed on a sloping surface of a second side of each ridge structure; and the first side and the second side are two opposite sides;
in each first view field region, a length of each light-transmitting region along a direction of the sloping surface with the light shield layer is less than a length of the sloping surface with the light shield layer of the first side;
in each second view field region, a length of each light-transmitting region along the direction of the sloping surface with the light shield layer is less than a length of the sloping surface with the light shield layer of the second side; and the CF layer is formed in the light-transmitting regions on the ridge structures.

13. The display device according to claim 12, wherein the display panel includes an array substrate and an opposing substrate arranged opposite to each other; and the grating is disposed on one side of the opposing substrate.

14. The display device according to claim 12, wherein the display panel includes an array substrate and an opposing substrate arranged opposite to each other; and the substrate of the grating is a base substrate of the opposing substrate.

15. The display device according to claim 12, wherein a black matrix is also formed on the substrate of the grating.

16. The display device according to claim 12, wherein the display panel is a liquid crystal display (LCD) panel or an organic light-emitting diode (OLED) display panel.

* * * * *